(12) United States Patent
Bae et al.

(10) Patent No.: US 10,646,957 B2
(45) Date of Patent: May 12, 2020

(54) FLEXIBLE DISPLAY PANEL, METHOD FOR MANUFACTURING FLEXIBLE DISPLAY PANEL, AND APPARATUS FOR MANUFACTURING FLEXIBLE DISPLAY PANEL

(71) Applicant: Samsung Display Co., Ltd., Yongin-si (KR)

(72) Inventors: Yoongyeong Bae, Goyang-si (KR); Ilseob Yoon, Asan-si (KR); Seongchae Jeong, Suwon-si (KR); Inae Han, Suwon-si (KR); Gyoowan Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 413 days.

(21) Appl. No.: 15/435,523

(22) Filed: Feb. 17, 2017

(65) Prior Publication Data
US 2018/0182983 A1    Jun. 28, 2018

(30) Foreign Application Priority Data
Dec. 22, 2016 (KR) .......................... 10-2016-0176473

(51) Int. Cl.
| | | |
|---|---|---|
| *H01L 51/00* | (2006.01) | |
| *B23K 26/082* | (2014.01) | |
| *H01L 25/16* | (2006.01) | |
| *B32B 3/30* | (2006.01) | |
| *B32B 7/12* | (2006.01) | |

(Continued)

(52) U.S. Cl.
CPC .......... *B23K 26/082* (2015.10); *B23K 26/364* (2015.10); *B32B 3/30* (2013.01); *B32B 7/12* (2013.01); *H01L 25/167* (2013.01); *H01L 51/0097* (2013.01); *B32B 2457/20* (2013.01);
(Continued)

(58) Field of Classification Search
CPC .......... B32B 7/12; B32B 3/30; B23K 26/364; B23K 26/082; H01L 25/50; H01L 25/167; H01L 51/0097
See application file for complete search history.

(56) References Cited

U.S. PATENT DOCUMENTS

| | | | | |
|---|---|---|---|---|
| 2004/0164061 A1* | 8/2004 | Takeuchi | ........... | B23K 26/0853 219/121.73 |
| 2005/0155954 A1* | 7/2005 | Oba | ...................... | B28D 5/023 219/121.67 |

(Continued)

FOREIGN PATENT DOCUMENTS

| | | |
|---|---|---|
| KR | 10-2013-0017748 | 2/2013 |
| KR | 10-2014-0049075 | 4/2014 |

(Continued)

*Primary Examiner* — Daniel McNally
(74) *Attorney, Agent, or Firm* — H.C. Park & Associates, PLC

(57) ABSTRACT

A method of manufacturing a flexible display panel includes forming a groove in a first area of a layered structure of the flexible display panel, and bending a portion of the first area including the groove from a plane of a second area of the layered structure. The second area extends from the first area. Forming the groove includes radiating a pulsating laser beam along an imaginary line corresponding to the groove such that an overlap ratio between consecutive pulse spots of the pulsating laser beam is greater than or equal to 0.80 and less than or equal to 0.90.

14 Claims, 9 Drawing Sheets

(51) Int. Cl.
  *B23K 26/364* (2014.01)
  *H01L 27/32* (2006.01)
(52) U.S. Cl.
  CPC .. *H01L 27/3244* (2013.01); *H01L 2251/5338* (2013.01); *Y02E 10/549* (2013.01)

(56) References Cited

U.S. PATENT DOCUMENTS

| | | |
|---|---|---|
| 2014/0164687 A1 | 6/2014 | Kwon et al. |
| 2015/0014644 A1* | 1/2015 | Namkung ........... H01L 51/0097 257/40 |
| 2015/0239066 A1 | 8/2015 | Sung et al. |
| 2016/0049499 A1 | 2/2016 | Rosenbaum et al. |

FOREIGN PATENT DOCUMENTS

| | | |
|---|---|---|
| KR | 10-2014-0064366 | 5/2014 |
| KR | 10-2014-0105414 | 9/2014 |
| KR | 10-2015-0102164 | 9/2015 |
| KR | 10-1417924 | 9/2015 |
| KR | 10-1605037 | 4/2016 |

\* cited by examiner

FLEXIBLE DISPLAY PANEL, METHOD FOR MANUFACTURING FLEXIBLE DISPLAY PANEL, AND APPARATUS FOR MANUFACTURING FLEXIBLE DISPLAY PANEL

CROSS-REFERENCE TO RELATED APPLICATION

This application claims priority from and the benefit of Korean Patent Application No. 10-2016-0176473, filed on Dec. 22, 2016, which is hereby incorporated by reference for all purposes as if fully set forth herein.

BACKGROUND

Field

One or more exemplary embodiments relate to flexible display technology and manufacturing flexible displays, and, more particularly, to a flexible display panel, a method for manufacturing a flexible display panel, and an apparatus for manufacturing a flexible display panel.

Discussion

Display devices have become iconographies of modern information consuming societies. Whether in the form of a cellular phone, consumer appliance, portable computer, television, or the like, aesthetic and ergonomic appeal are as much design considerations as display quality and overall performance. As such, greater attention is being directed towards developing display devices with minimal to no bezel configurations. Flexible display panels capable of permanent deformation (e.g., bending) in areas outlying a display area, and, thereby, capable of reducing the planar surface area of these outlying areas, are gaining traction at least because such configurations also enable peripheral circuitry to remain proximate to the display area. It is noted, however, that as the bend radius of an outlying area decreases, an increasing amount of stress is applied to the bending area. This increase in stress may increase resistivity in and reduce reliability of, for example, signal lines extending between the display area and the peripheral circuitry configured to drive pixels of the display area. A need, therefore, exists for efficient, cost-effective techniques enabling flexible display panels to be permanently deformed at relatively small bend radii, but maintain sufficient levels of performance and reliability.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a manufacturing apparatus.

One or more exemplary embodiments provide a flexible display panel.

One or more exemplary embodiments provide a method for manufacturing a flexible display panel.

Additional aspects will be set forth in the detailed description which follows, and, in part, will be apparent from the disclosure, or may be learned by practice of the inventive concept.

According to one or more exemplary embodiments, an apparatus includes at least one processor and at least one memory. The at least one memory includes one or more sequences of one or more instructions that, when executed by the at least one processor, cause the apparatus at least to: control a laser source to pulse an output laser beam towards a target; and control at least one of the laser source and the target to scan relative to the other such that an overlap ratio between consecutive pulse spots of the output laser beam is greater than or equal to 0.80 and less than or equal to 0.90.

According to one or more exemplary embodiments, a flexible display panel includes a support layer, a flexible substrate disposed on the support layer, and an adhesive layer coupling the flexible substrate to the support layer. The support layer includes a notched portion extending in a first direction, a surface of the notched portion includes grain lines protruding in a second direction crossing the first direction. A ratio between a width of a grain line of the grain lines and a pitch between the grain lines is greater than or equal to 0.0196 and less than or equal to 0.0397, the width of the grain line extending in the second direction and the pitch between the grain lines extending in the first direction.

According to one or more exemplary embodiments, a method of manufacturing a flexible display panel includes forming a groove in a first area of a layered structure of the flexible display panel, and bending a portion of the first area including the groove from a plane of a second area of the layered structure. The second area extends from the first area. Forming the groove includes radiating a pulsating laser beam along an imaginary line corresponding to the groove such that an overlap ratio between consecutive pulse spots of the pulsating laser beam is greater than or equal to 80% and less than or equal to 90%.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 2:
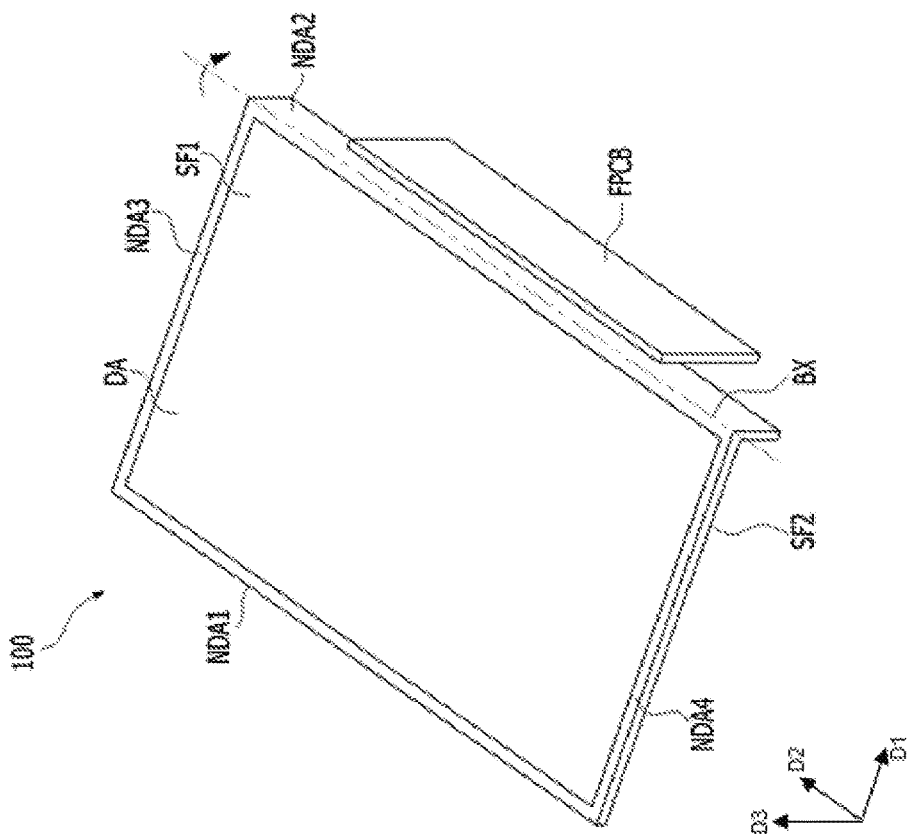
FIG. 2 is a perspective view of the flexible display panel of FIG. 1 in a first bent state, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

For instance, one or more exemplary embodiments may be described and/or illustrated in terms of functional blocks, units, and/or modules. One of ordinary skill in the art will appreciate that these blocks, units, and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or similar devices, the blocks, units, and/or modules may be programmed using software (e.g., microcode) to perform various features, functions, and/or processes discussed herein, and may optionally be driven by firmware and/or software. Alternatively, each block, unit, and/or module may be implemented by dedicated hardware, or as a combination of dedicated hardware to perform some functions and a processor (e.g., one or more programmed microprocessors and associated circuitry) to perform other functions. Also, without departing from the scope of the inventive concepts, a block, unit, and/or module may be physically separated into two or more interacting and discrete blocks, units, and/or modules or may be physically combined into more complex blocks, units, and/or modules.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," "third," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing various exemplary embodiments and is not intended to be limiting. As used herein, the singular forms, "a," "an,"

and "the" are intended to include the plural forms as well, unless the context clearly indicates otherwise. Moreover, the terms "comprises," "comprising," "includes," and/or "including," when used herein, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

According to one or more exemplary embodiments, a flexible display panel refers to a display panel having various degrees of flexibility, and may have the same meaning as a bendable display panel, a rollable display panel, a foldable display panel, a twistable display panel, and the like.

Although various exemplary embodiments are described with respect to flexible organic light emitting display panels, it is contemplated that various exemplary embodiments are also applicable to other flexible display panels, such as flexible liquid crystal display panels, flexible inorganic electroluminescent display panels, flexible field emission display panels, flexible plasma display panels, flexible electrophoretic display panels, flexible electrowetting display panels, and the like. Further, although various exemplary embodiments are described with respect to flexible display panels incorporated as part of a mobile phone, exemplary embodiments are also applicable to other electronic devices incorporating a flexible display panel, such as televisions, media players, notebook computers, gaming devices, tablets, monitors, navigational aids, pendant devices, billboards, wrist watches, headphones, earpiece devices, consumer appliances, etc. It is also contemplated that exemplary embodiments are applicable to configuring other flexible devices, such as configuring flexible light receiving components of, for instance, photovoltaic cells, configuring flexible touch screen devices, etc.

Figure 1:
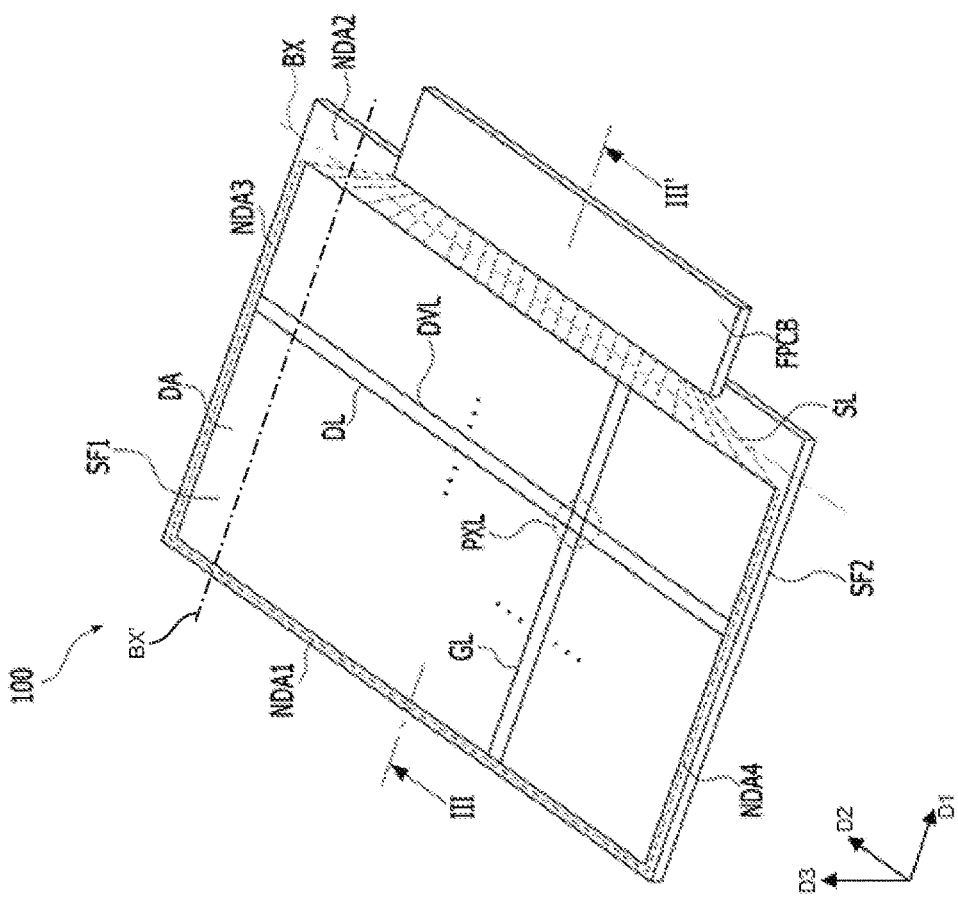
FIG. 1 is a perspective view of a flexible display panel in a non-bent state, according to one or more exemplary embodiments.
Figure 3:
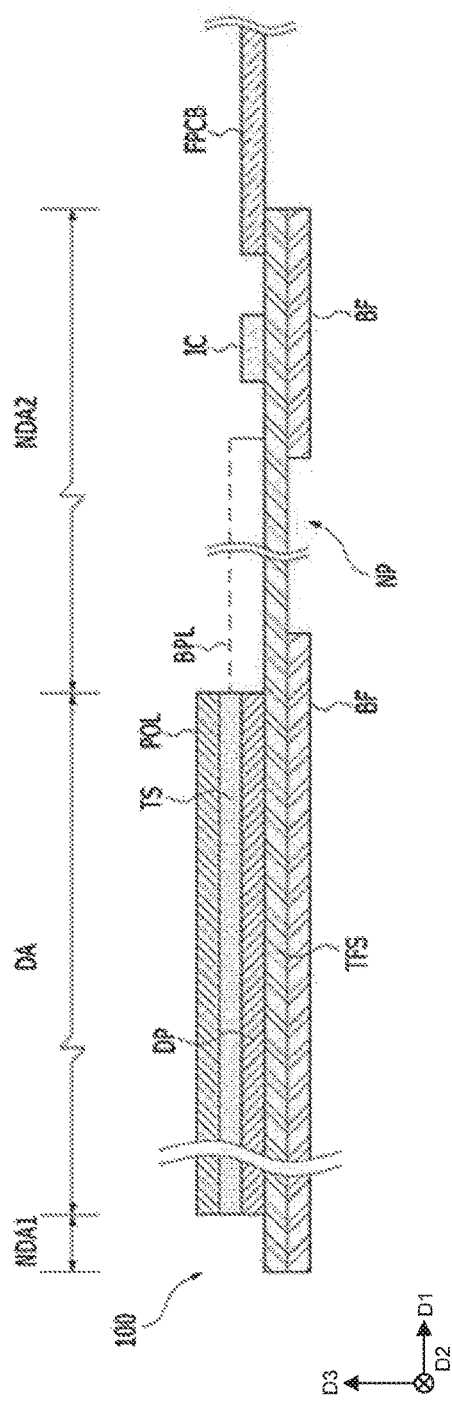
FIG. 3 is a cross-sectional view of the flexible display panel of FIG. 1 taken along sectional line III-III', according to one or more exemplary embodiments.
Figure 4A:
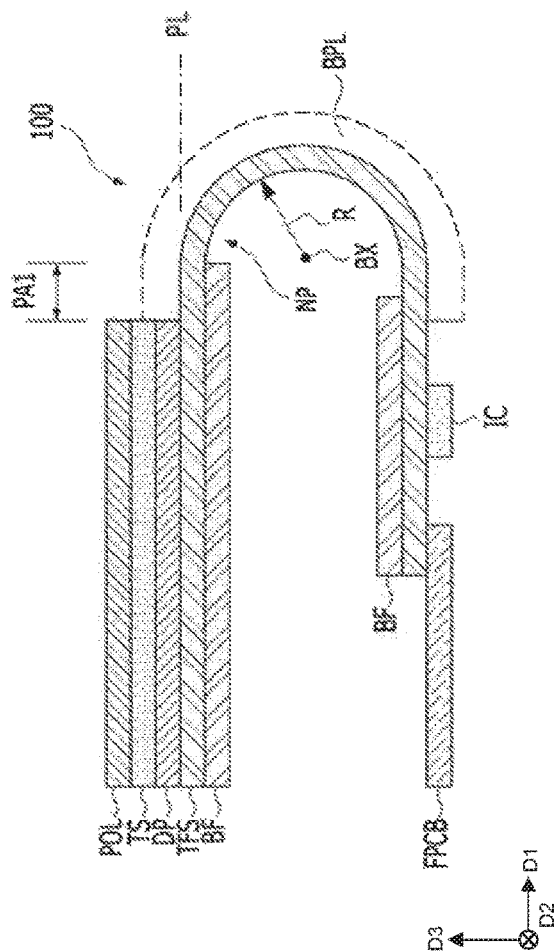
FIG. 4A is cross-sectional view of the flexible display panel of FIG. 1 taken along sectional line III-III' in a second bent state, according to one or more exemplary embodiments.

FIG. 1 is a perspective view of a flexible display panel in a non-bent state, according to one or more exemplary embodiments. FIG. 2 is a perspective view of the flexible display panel of FIG. 1 in a first bent state, according to one or more exemplary embodiments. FIG. 3 is a cross-sectional view of the flexible display panel of FIG. 1 taken along sectional line III-III', according to one or more exemplary embodiments. FIG. 4A is cross-sectional view of the flexible display panel of FIG. 1 taken along sectional line III-III' in a second bent state, according to one or more exemplary embodiments.

Referring to FIGS. 1 to 3 and 4A, flexible display panel 100 includes flexible substrate TFS upon which display panel layer DP, touch screen layer TS, and anti-reflection layer POL may be disposed. Flexible substrate TFS may be disposed on support layer BF. For instance, support layer BF may be coupled to flexible substrate TFS via an adhesive layer (not shown). One or more components, such as integrated circuit IC and flexible printed circuit board FPCB, may be coupled to (or otherwise formed on) flexible substrate TFS. To this end, flexible display panel 100 may also include bending protection layer BPL. Although specific reference will be made to this implementation, it is contemplated that flexible display panel 100 may embody many forms and include multiple and/or alternative components. For example, it is contemplated that one or more components of flexible display panel 100 may be combined, formed as part of separate structures, deformed in an alternative manner, etc.

For convenience, a surface of flexible display panel 100 on which an image may be perceived, will be referred to as first (or front) surface SF1. An opposite (or opposing) surface of flexible display panel 100 will be referred to as second (or back) surface SF2.

According to one or more exemplary embodiments, flexible display panel 100 may be incorporated as part of an electronic device (not shown), such as a mobile phone. In this manner, the electronic device may include a housing (not illustrated) configured to support at least a portion of flexible display panel 100 and one or more other components of the electronic device, such as one or more drivers, which may be electrically connected to (or interface with) flexible display panel 100 via, for instance, at least one of integrated circuit IC and flexible printed circuit board FPCB. The housing may be formed of any suitable material, such as plastics, glasses, ceramics, composites, metals, or other materials, or a combination thereof. As such, the housing may have a unibody configuration or may be formed from multiple structures.

For descriptive and illustrative convenience, flexible display panel 100 will be described as a flexible organic light emitting diode (OLED) display panel, however, exemplary embodiments are not limited thereto or thereby. In this manner, display panel layer DP may be an OLED display panel layer, or any other suitable display panel layer. As seen in FIGS. 3 and 4A, flexible display panel 100 may include touch sensor layer TS. The touch sensor layer TS may be formed as any suitable touch sensitive layer, such as a capacitive touch sensor layer, a resistive touch sensor layer, a surface acoustic wave touch sensor layer, an infrared touch sensor layer, a near field imaging touch sensor layer, etc. As such, flexible display panel 100 may provide a touch screen feature. Flexible display panel 100 may also include anti-reflection layer POL, which may be configured to darken an image displayed via display panel layer DP, manage reflection of ambient light, suppress glare, and/or the like. In this manner, anti-reflection layer POL may protect display panel layer DP from ambient light or at least reduce the effect of ambient light on the display quality of display panel layer DP.

Although illustrated as separate layers, touch sensor layer TS and/or anti-reflection layer POL may be incorporated as part of another layer of flexible display panel 100, such as part of display panel layer DP. For instance, touch sensor layer TS may be formed on a thin-film encapsulation layer (not shown) of display panel layer DP that covers, for instance, an electroluminescence layer (not illustrated) of display panel layer DP configured to emit light as part of displaying an image via flexible display panel 100. It is also contemplated that at least one of touch sensor layer TS and anti-reflection layer POL may be provided as a separate module coupled to display panel layer DP.

According to one or more exemplary embodiments, flexible display panel 100 is a deformable (e.g., bendable, foldable, flexible, stretchable, rollable, etc.) display panel including flexible substrate TFS on which display panel layer DP is disposed. Flexible substrate TFS may be formed of any suitable material, such as, for example, a glass material, a quartz material, a ceramic material, a metal material, a plastic material, etc. For instance, flexible substrate TFS may be formed of a polymer material, e.g., polyarylate (PAR), polybeneimidazole (PBI), polycarbonate (PC), polyetherimide (PEI), polyethylene naphthalate (PEN), polyethersulphone (PES), polyethylene terephthalate (PET), polysulfone, and/or polyimide (PI).

Although not illustrated, flexible substrate TFS may be formed as a multilayered structure including one or more organic material layers (e.g. one or more polymer materials) and one or more inorganic material layers (e.g., one or more of silicon nitride ($SiN_x$), silicon oxide ($SiO_x$), silicon oxynitride ($SiO_xN_y$), and the like). The one or more organic material layers and the one or more inorganic material layers may be stacked in any suitable fashion, e.g., alternately stacked, symmetrically ordered, etc. It is contemplated that one or more conductive layers, e.g., metal layers, may be embedded in flexible substrate TFS. For instance, one or more conductive layers may be disposed between layers of a multilayer structure forming flexible substrate TFS. It is also noted that the material configuration of flexible substrate TFS may exhibit a higher melting and/or sublimating temperature than a material configuration of support layer BF.

Display panel layer DP is configured to display an image by combining light from pixels (e.g., pixel PXL) disposed in display area DA of flexible display panel 100. Display area DA may also correspond to an active area, such as an active area of display panel layer DP, an active area of touch sensing layer TS, etc. In this manner, the active area may be a region in which a function of flexible display panel 100 is provided to a user, such as a display function, a touch sensing function, etc. For descriptive and illustrative convenience, display area DA and the active area may be referred to as display area DA. Pixels PXL may be arranged in any suitable formation, such as a matrix formation, in at least the display area DA. One or more non-display areas (e.g., non-display areas NDA1, NDA2, NDA3, and NDA4) may be disposed outside of display area DA. The one or more non-display areas may also correspond to an inactive area, such as an inactive area of display panel layer DP, an inactive area of touch sensing layer TS, etc. In this manner, the inactive area may be a region in which the function provided in display area DA is not provided. For descriptive and illustrative convenience, the one or more non-display areas (e.g., non-display areas NDA1, NDA2, NDA3, and NDA4) and the inactive area may be referred to as non-display areas.

The one or more non-display areas may include first non-display area NDA1, second non-display area NDA2, third non-display area NDA3, and fourth non-display area NDA4. It is noted that first to fourth non-display areas NDA1 to NDA4 may surround display area DA, but are at least disposed outside of (or adjacent to) display area DA. As seen in FIGS. 1 and 2, first non-display area NDA1 and second non-display area NDA2 are spaced apart from one another and face one another when flexible display panel 100 is viewed in a plan view, e.g., when viewed in direction D3. To this end, third non-display area NDA3 and fourth non-display area NDA4 may be respectively adjacent to first non-display area NDA1 and second non-display area NDA2. Third non-display area NDA3 and fourth non-display area NDA4 may be spaced apart from one another and face one another when flexible display panel 100 is viewed in a plan view. One or more portions of first to fourth non-display areas NDA1 to NDA4 may be covered by an opaque masking material (not illustrated), such as a light blocking layer formed of, for instance, a polymer including carbon black pigmentation, a layer of opaque metal material, and/or the like. It is also contemplated that the opaque masking material may be mixed in one or more portions of flexible substrate TFS and/or support layer BF that correspond to first to fourth non-display areas NDA1 to NDA4. The opaque masking material may help conceal components disposed in association with at least one of first to fourth non-display areas NDA1 to NDA4.

According to one or more exemplary embodiments, pixels PXL may be driven, at least in part, via at least one of a main driver (not shown), a gate driver (not illustrated), a data driver (not shown), and a power source (not illustrated). At least one of the main driver, the gate driver, the data driver, and the power source may be coupled to (or integrated as part of) flexible printed circuit board FPCB and/or integrated circuit IC.

For instance, the data driver and/or the gate driver may be coupled to a surface of a non-display area of flexible display panel 100 via a chip-on-plastic (COP) technique or a chip-on-film (COF) technique (the film being, for example, a flexible film), and the main driver may be disposed on flexible printed circuit board FPCB. In one or more exemplary embodiments, a COP technique may include mounting an integrated circuit forming a driving circuit (e.g., the data driver, the gate driver, etc.) on flexible substrate TFS via a conductive film (not illustrated), such as an anisotropic conductive film. A COF technique may, for example, include mounting an integrated circuit forming a driving circuit (e.g., the data driver, the gate driver, etc.) on a film (not shown), the film being utilized to couple flexible printed circuit board FPCB to flexible substrate TFS. It is noted that the main driver may be connected to the data driver and the gate driver via signal lines SL. Flexible printed circuit board FPCB may include a flexible printed circuit and a multilayer printed circuit board; however, exemplary embodiments are not limited thereto or thereby. As another example, the data driver and/or the gate driver may be coupled to a non-display area of flexible display panel 100 via a tape-automated bonding (TAB) method. In this manner, the main driver, the gate driver, and the data driver may be disposed on flexible printed circuit board FPCB, and, thereby, be electrically connected to one another. For instance, flexible printed circuit board FPCB may include a tape carrier package (TCP) on which the data driver and/or the gate driver may be mounted, and a multilayer printed circuit board on which the main driver may be mounted. The multilayer printed circuit board may be connected to the TCP. Also, the power source (e.g., an external power source) may be connected to the main driver.

According to one or more exemplary embodiments, signal lines SL may extend between pixels PXL and at least one of the main driver, the gate driver, the data driver, and the power source. It is also contemplated that one or more of signal lines SL may be connected to one or more pixels PXL, but not connected to at least one of the main driver, the gate driver, the data driver. In this manner, signal lines SL may generally be disposed in at least one of first to fourth non-display areas NDA1 to NDA4 and extend into display area DA. Although signal lines SL are illustrated as crossing bending axis BX at various angles, it is contemplated that signal lines SL may extend across bending axis BX in first direction D1, e.g., in a direction perpendicular to bending axis BX. It is also contemplated that signal lines SL may include patterned portions (e.g., meshed portions) in at least one of first to fourth non-display areas NDA1 to NDA4, e.g., in second non-display area NDA2. For instance, the patterned portions may overlap bending axis BX. To this end, signal lines SL may be connected to or form signal lines disposed in display area DA, such as gate lines GL, data lines DL, and data voltage lines DVL. As such, pixels PXL may display an image based on signals received from at least one of the main driver, the gate driver, the data driver, and the power source. An equivalent circuit of a representative pixel is described in more detail in association with FIG. 5.

Figure 5:
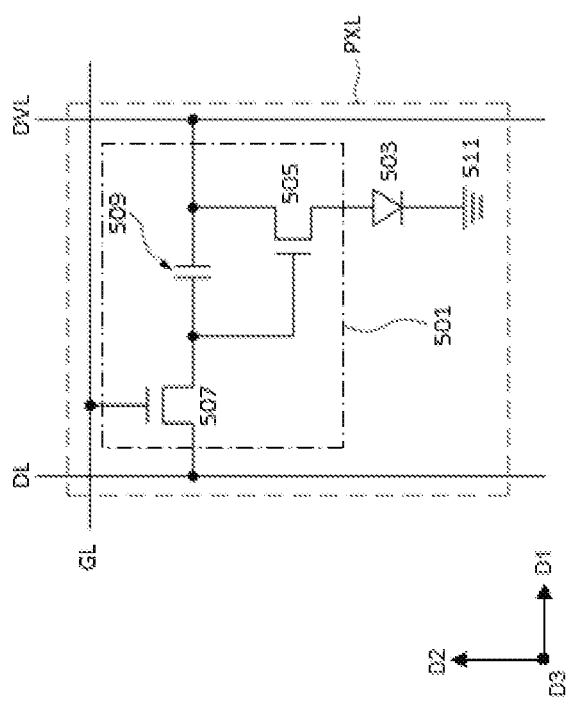
FIG. 5 is an equivalent circuit diagram of a pixel of the flexible display panel of FIG. 1, according to one or more exemplary embodiments.

FIG. 5 is an equivalent circuit diagram of a pixel of the flexible display panel of FIG. 1, according to one or more exemplary embodiments. It is noted that pixel PXL of FIG. 5 may be representative of the various pixels of flexible display panel 100.

With continued reference to FIG. 1, pixel PXL may include pixel circuit 501 connected to gate line GL extending in first direction D1, data line DL extending in second direction D2, and driving voltage line DVL also extending in second direction D2. Second direction D2 may cross first direction D1. To this end, first and second directions D1 and D2 may cross third direction D3. It is also noted that organic light emitting diode 503 is connected to pixel circuit 501. As seen in FIG. 5, pixel circuit 501 includes driving thin film transistor (TFT) 505, switching TFT 507, and storage capacitor 509. Although reference will be made to this implementation, it is also contemplated that pixel circuit 501 may embody many forms and include multiple and/or alternative components and configurations. For instance, pixel circuit 501 may include any suitable number of thin film transistors and any suitable number of storage capacitors. As such, the equivalent circuit diagram of FIG. 5 is merely illustrative; exemplary embodiments are not limited thereto or thereby. In this manner, any suitable pixel circuit may be utilized in association with exemplary embodiments.

In one or more exemplary embodiments, switching TFT 507 includes a first electrode connected to gate line GL, a second electrode connected to data line DL, and a third electrode connected to a first electrode of storage capacitor 509 and a first electrode of driving TFT 505. In this manner, switching TFT 507 is configured to transfer a data signal Dm received via data line DL to driving TFT 505 in response to a scan signal Sn received via gate line GL. As previously mentioned, the first electrode of storage capacitor 509 is connected to the third electrode of switching TFT 507. A second electrode of storage capacitor 509 is connected to driving voltage line DVL and a second electrode of driving TFT 505. As such, storage capacitor 509 is configured to store a voltage corresponding to a difference between a voltage received via switching TFT 507 and a driving voltage ELVDD received via driving voltage line DVL.

The second electrode of driving TFT 505 is connected to driving voltage line DVL and the second electrode of storage capacitor 509. Driving TFT 505 also includes a first electrode connected to the third electrode of switching TFT 507 and a third electrode connected to a first electrode of organic light emitting diode 503. In this manner, driving TFT 505 is configured to control a driving current through organic light emitting diode 503 from driving voltage line DVL in response to the voltage value stored in storage capacitor 509. The organic light emitting diode 503 includes a first electrode connected to the third electrode of driving TFT 505 and a second electrode connected to common power voltage 511, e.g., a common power voltage ELVSS. As such, organic light emitting diode 503 may emit light at a determined brightness (and, in one or more exemplary embodiments, a determined color) according to the driving current received via driving TFT 505.

According to one or more exemplary embodiments, driving TFT 505 and switching TFT 507 may each include an active layer (not shown) disposed in association with the various electrodes of the corresponding thin film transistor. The active layer may be formed of any suitable semiconductor material. For example, the active layer may contain an inorganic semiconductor material, such as amorphous silicon or polysilicon crystallized from amorphous silicon. The active layer may contain an oxide semiconductor material, such as an oxide of a material selected from a group XII, XIII, or XIV element, such as zinc (Zn), indium (In), gallium (Ga), tin (Sn), cadmium (Cd), germanium (Ge), and hafnium (Hf), or combinations thereof. It is also noted that the active layer may be formed of a relatively low polymer-series or polymer-series organic material, such as mellocyanine, phthalocyanine, pentacene, thiophen, etc.

Although not illustrated, organic light emitting diode 503 may include a pixel electrode, an opposite electrode, and an intermediate layer disposed between the pixel electrode and the opposite electrode. The intermediate layer may be configured to emit light according to a voltage difference across the pixel electrode and the opposite electrode. In this manner, the pixel electrode may function as the first electrode (e.g., an anode electrode) of organic light emitting diode 503, and the opposite electrode may function as the second electrode (e.g., cathode electrode) organic light emitting diode 503. The second electrode may be a common electrode common to various pixels PXL of flexible display panel 100. It is also contemplated that the polarities of the pixel electrode and the opposite electrode may be reversed.

According to one or more exemplary embodiments, the pixel electrode and the opposite electrode are insulated from each other via the intermediate layer. An organic emission layer of the intermediate layer may emit light according to voltages of different polarities applied to the intermediate layer. In this manner, the intermediate layer may include an organic emission layer. In one or more exemplary embodiments, the intermediate layer may include the organic emission layer, as well as include at least one layer selected from the group consisting of a hole injection layer (HIL), a hole transport layer (HTL), an electron transport layer (ETL), and an electron injection layer (EIL).

Although a light emitting material may be separately included in respective pixels PXL of the above-noted organic light emission layer, exemplary embodiments are not limited thereto or thereby. For example, the organic light emission layer may be a common organic light emission layer used for each pixel PXL regardless of its location.

According to one or more exemplary embodiments, the organic light emission layer may include light emitting materials to respectively emit red light, green light, and blue light; however, any other suitable color may be utilized in association with exemplary embodiments. The light emitting materials may be stacked in a vertical direction or disposed in a mixed manner. The light emitting materials may include materials to emit a combination of different colors. The combination of different colors may be utilized to form white light. Although not illustrated, a color conversion layer or a color filter may be included to convert the emitted white light to a certain color.

Adverting back to FIGS. 1 to 3 and 4A, flexible display panel 100 may also include support layer BF, which may be coupled to (or formed on) flexible substrate TFS after a carrier substrate (not shown) is removed as part of manufacturing flexible display panel 100. An exemplary process of forming flexible display panel 100 including utilization of a carrier substrate is described in more detail in association with FIG. 6. Support layer BF may be formed of any suitable material. For instance, support layer BF may be formed of polyethylene (PE), polystyrene (PS), polyethylene terephthalate (PET), polyvinyl chloride (PVC), polyethylene naphthalate (PEN), etc. As previously mentioned, the material configuration of support layer BF may exhibit a lower melting and/or sublimating temperature than a material configuration of flexible substrate TFS. According to one or more exemplary embodiments, support layer BF may be greater than 0 μm thick and less than or equal to 100 μm thick, e.g., greater than or equal to 50 μm thick and less than or equal to 80 μm thick, such as 75 μm thick. Exemplary embodiments, however, are not limited thereto or thereby.

In one or more exemplary embodiments, support layer BF may be coupled to flexible substrate TFS via any suitable technique, whether mechanically, chemically, etc. For example, support layer BF may be coupled to flexible substrate TFS via an adhesive layer formed of any suitable aqueous adhesive and/or non-aqueous adhesive. For instance, support layer BF may be coupled to flexible substrate TFS via an optically clear adhesive (OCA), pressure sensitive adhesive (PSA), etc. It is noted that the adhesive layer may be greater 0 μm thick and less than or equal to 20 μm thick, e.g., greater than or equal to 5 μm thick and less than or equal to 15 μm thick, such as 13 μm thick.

According to one or more exemplary embodiments, support layer BF may include one or more notched portions (e.g., notched portion NP) in an area disposed in association with a bending axis (e.g., bending axis BX). As seen in FIGS. 3 and 4A, support layer BF may be completely removed in notched portion NP. It is contemplated, however, that support layer BF may exhibit a difference in thickness in notched portion NP. For instance, a thickness of support layer BF may be smaller (e.g., thinned) in notched portion NP. As will become more apparent below, an adhesive layer coupling support layer BF to flexible substrate TFS may also be removed (or thinned) in notched portion NP. In one or more exemplary embodiments, notched portion NP does not extend into flexible substrate TFS. When viewed in a plan view, notched portion NP may correspond to a groove (or other patterned formation) longitudinally extending in second direction D2 having a width extending in first direction D1 and a thickness extending in third direction D3. It is contemplated, however, that notched portion NP may extend in any other suitable manner, such as diagonally, arcuately, etc. For instance, notched portion NP may longitudinally extend in first direction D1 having a width extending in second direction D2 and a thickness extending in third direction D3. In this manner, a bending axis (e.g., bending axis BX') and an associated notched portion may overlap with display area DA. Other features and processes to form notched portion NP are described in more detail with referenced to FIGS. 7 to 11, 12A to 12C, and 13 to 17. It is noted, however, that notched portion NP may be at least partially formed via laser ablation, cutting, drilling, engraving, and/or the like. For descriptive convenience, these laser techniques will be collectively and individually referred to as cutting.

According to one or more exemplary embodiments, one or more of first to fourth non-display areas NDA1 to NDA4 (e.g., second non-display area NDA2) may be bent from plane PL tangent to a surface of display panel layer DP to, for example, enhance aesthetics of flexible display panel 100 when incorporated as part of an electronic device. In this manner, a portion of bent non-display areas (e.g., a portion of second non-display area NDA2) may be bent, such as about bending axis BX and under display panel layer DP to reduce a size and exposure of the non-display area when first surface SF1 of flexible display panel 100 is viewed in a plan view. For instance, a size and exposure of portion PA1 may be reduced by bending second non-display area NDA2 with respect to bending axis BX and plane PL. It is noted, however, that flexible display panel 100 may be bent at angles greater than 0 degrees and less than or equal to 360 degrees, e.g., at angles greater than 0 degrees and less than or equal to 270 degrees. Further, although only second non-display area NDA2 is illustrated as being bent, it is contemplated that one or more of first to fourth non-display areas NDA1 to NDA4 may be bent to reduce their respective sizes. To this end, a portion of display area DA may be bent in association with the bending of at least one of first to fourth non-display areas NDA1 to NDA4. In this manner, flexible display panel 100 may be bent to include a curved surface portion.

Figure 4B:
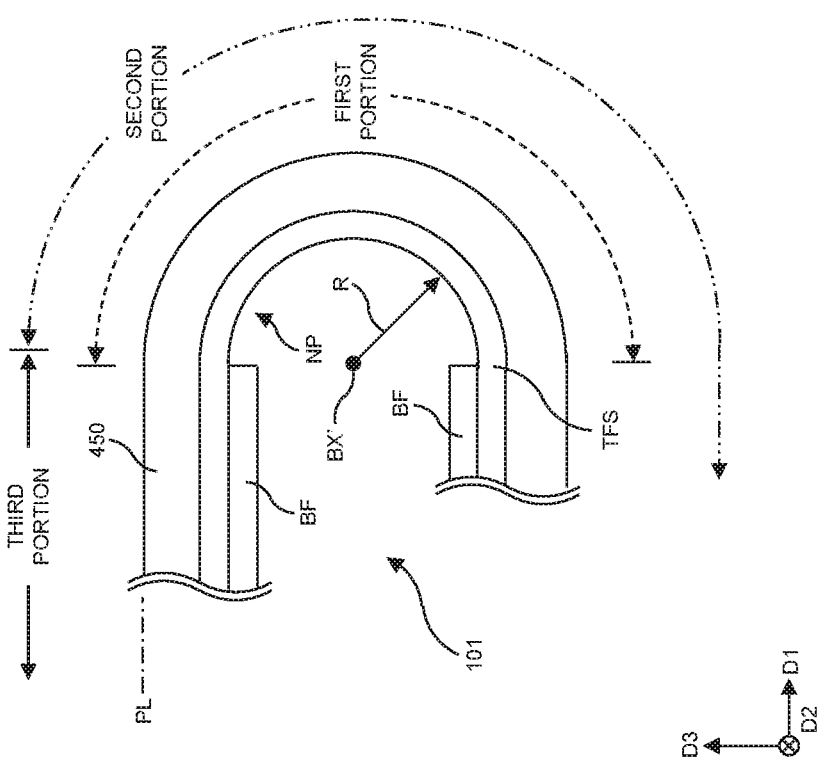
FIG. 4B is a cross-sectional view of a flexible display panel in a bent state, according to one or more exemplary embodiments.

FIG. 4B is a cross-sectional view of a flexible display panel in a bent state, according to one or more exemplary embodiments. Flexible display panel 101 is similar to flexible display panel 100 of FIG. 1, and, as such, duplicative descriptions are primarily omitted to avoid obscuring exemplary embodiments. For illustrative convenience, an exemplary bending axis BX' is illustrated in association with flexible display panel 100 of FIG. 1.

Referring to FIG. 4B, notched portion NP may be formed in a first portion of flexible display panel 101, e.g., formed in a first portion of at least support layer BF. The first portion may overlap one or more of display panel layer DP, touch screen layer TS, and anti-reflection layer POL that are collectively illustrated in FIG. 4B as structure 450. As previously mentioned in association with flexible display panel 100, flexible display panel 101 may include support layer BF coupled to flexible substrate TFS via an adhesive layer (not shown). In one or more exemplary embodiments, a second portion of flexible display panel 101 may be bent from plane PL tangent to a surface of structure 450, e.g., tangent to a surface of a third portion of flexible display panel 101. As such, the second portion of flexible display panel 101 may be bent about bending axis BX'. Although structure 450 is shown as being bent under itself, it is noted that the second portion of flexible display panel 101 may be bent at angles greater than 0 degrees and less than or equal to 360 degrees, e.g., at angles greater than 0 degrees and less than or equal to 270 degrees. In this manner, flexible display panel 101 may be bent to include a curved surface portion.

According to one or more exemplary embodiments, modification (e.g., notching, patterning, etc.) of support layer BF may be utilized to reduce the amount of force to bend a portion of flexible display panel 100 with respect to plane PL, and, thereby, to reduce the amount of stress generated when the portion is bent from plane PL. In this manner, reduction of the stress may reduce degradation of the structural integrity (e.g., reduce the potential for cracks, etc.) and performance (e.g., reduce the potential for increases in resistivity, etc.) of signal lines SL extending between pixels PXL and at least one of flexible printed circuit board FPCB and integrated circuit IC. Reduction of the stress may also enable a size of bending radius R of flexible display panel 100 to be reduced, and, thereby, enable an overall thickness of an electronic device incorporating flexible display panel 100 to be reduced. For instance, bending radius R may be greater than or equal to twice the thickness of support layer BF, such as greater than or equal to about 200 μm. It contemplated, however, that larger bending radii may be utilized in association with exemplary embodiments.

Figure 6:
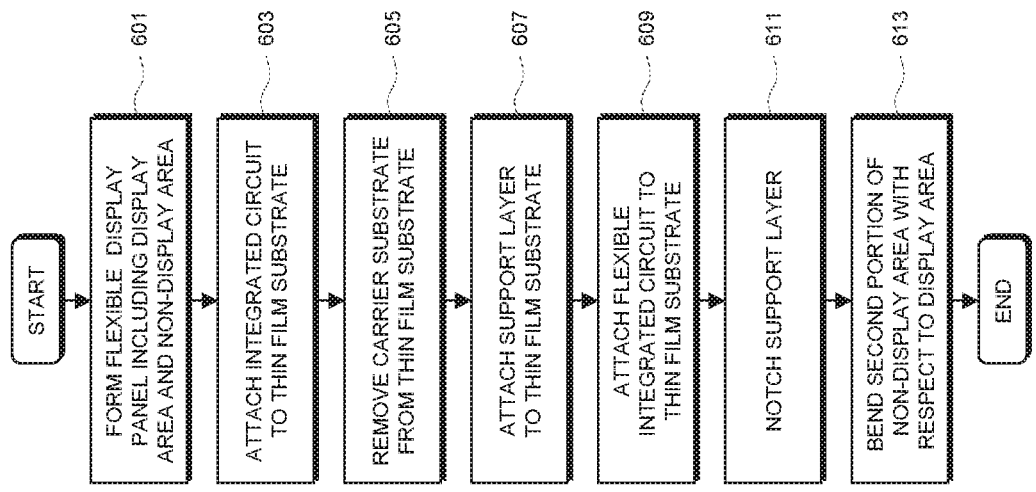
FIG. 6 is a flowchart of a process for forming a flexible display panel with at least one bent portion, according to one or more exemplary embodiments.

FIG. 6 is a flowchart of a process for forming a flexible display panel with at least one bent portion, according to one or more exemplary embodiments. The process of FIG. 6 will be described in association with FIGS. 1, 3, 4A, and 5. It is noted that the process of FIG. 6 will also be described in association with bending second non-display area NDA2, however, it is contemplated that one or more of first to fourth non-display areas NDA1 to NDA4 and/or display area DA may be bent in association with exemplary embodiments.

In step 601, one or more display structures, such as thin-film transistor structures, storage capacitor structures, organic light-emitting diode structures, gate lines GL, data lines DL, data voltage lines DVL, signal lines SL, and the like, may be formed on flexible substrate TFS, which may be a polyimide layer attached to a carrier substrate (not shown), such as a glass carrier substrate. In this manner, flexible display panel 100 may be partially formed including display area DA and first to fourth non-display areas NDA1 to NDA4. At step 603, one or more integrated circuits (e.g., integrated circuit IC), which may include at least one driver configured to cause, at least in part, pixels PXL to display an image, may be coupled to flexible substrate TFS. For instance, integrated circuit IC may be coupled to flexible substrate TFS in second non-display area NDA2. The carrier substrate may be removed, e.g., delaminated, from flexible substrate TFS, per step 605. At step 607, support layer BF may be attached to flexible substrate TFS via, for instance, an adhesive, e.g., an OCA layer, a PSA layer, etc. In step 609, flexible printed circuit board FPCB may be coupled to flexible substrate TFS via conductive adhesive.

According to one or more exemplary embodiments, a first portion of second non-display area NDA2 may be notched utilizing, for example, a laser, e.g., a carbon dioxide ($CO_2$) short-pulse laser, per step 611. An exemplary process of notching a flexible display panel is described in more detail with FIGS. 15 to 17. In step 613, a second portion of second non-display area NDA2 that extends from the first portion is bent with respect to display area DA. For example, the second portion may be bent with respect to plane PL tangent to a surface of display area DA. To this end, the second portion may be bent about bending axis BX, such that at least some of second non-display portion NDA2 is disposed under display area DA.

To reduce mechanical stress in flexible display panel 100 when, for instance, the second portion of second non-display area NDA2 is bent from display area DA, one or more techniques may be employed, e.g., laser ablation and notching techniques. An exemplary apparatus to notch a flexible display panel is described in association with FIGS. 7 and 8.

Figure 7:
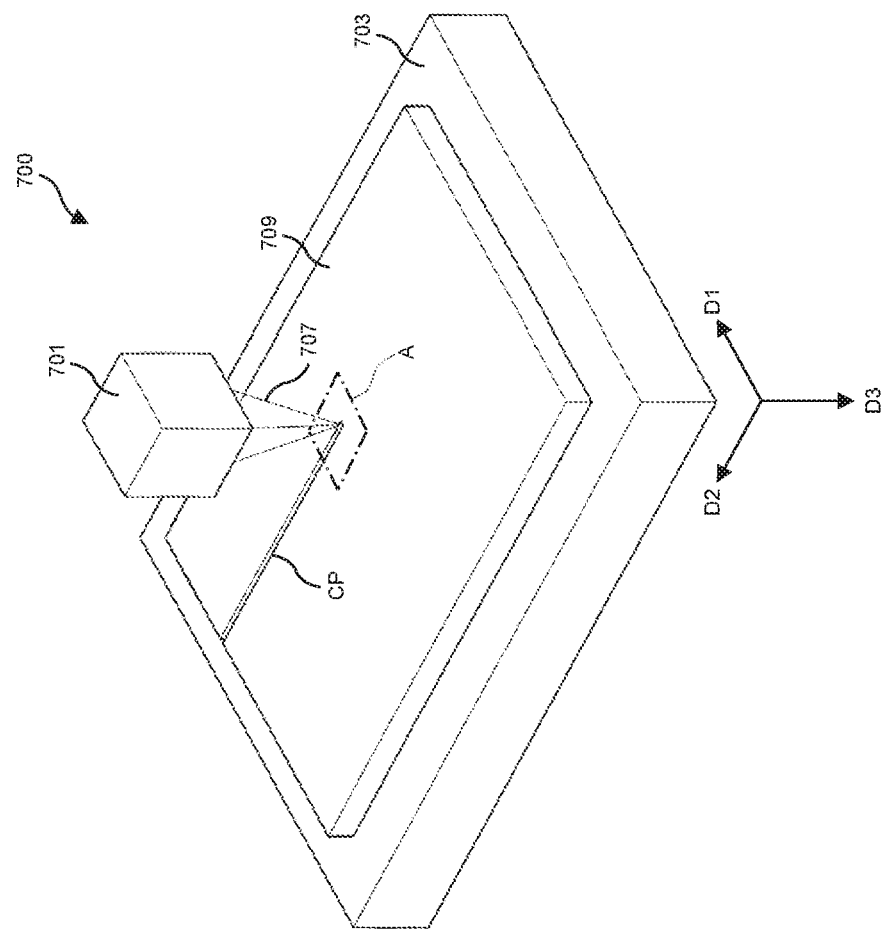
FIG. 7 is a perspective view of a laser machining apparatus, according to one or more exemplary embodiments.
Figure 8:
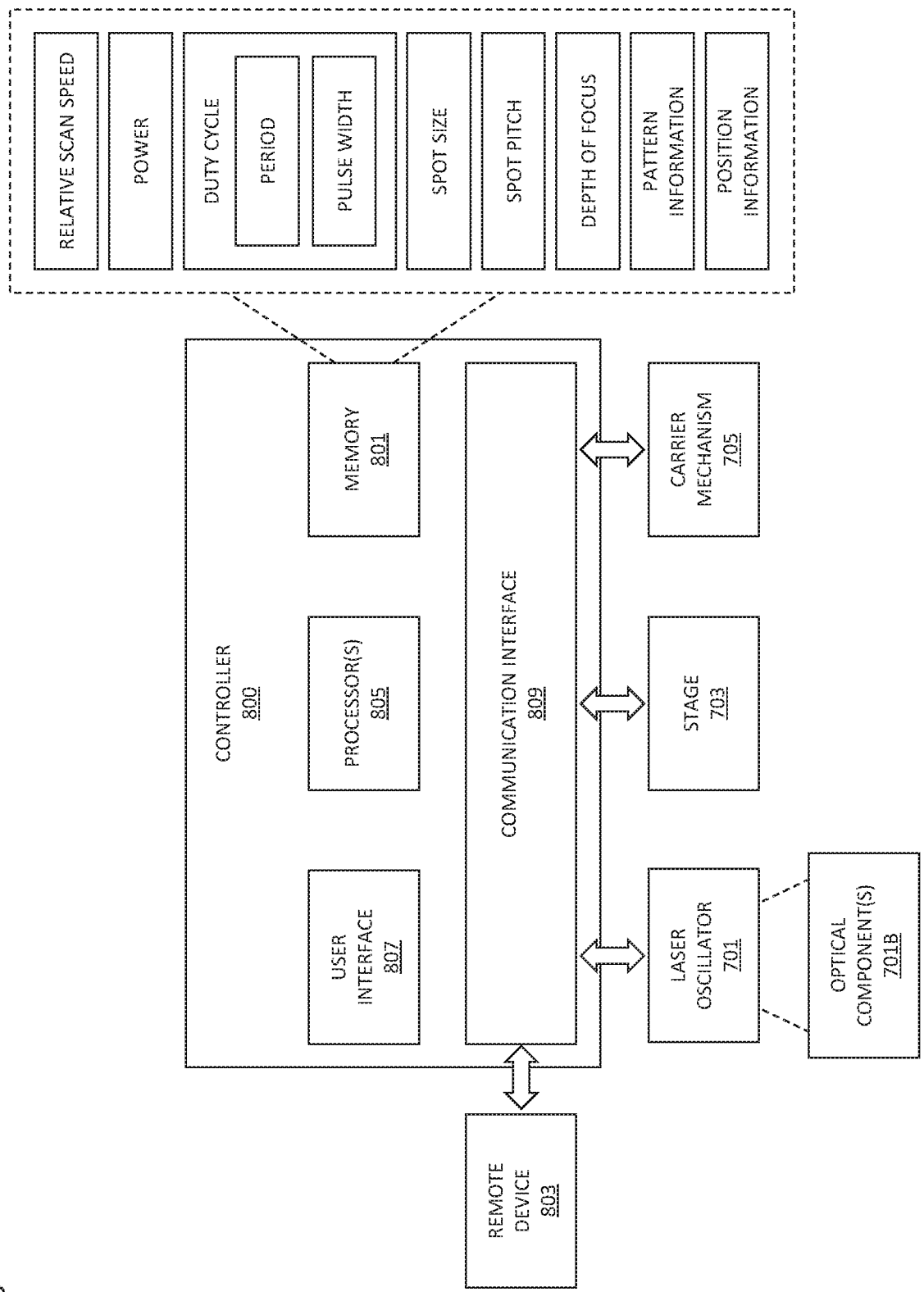
FIG. 8 is a block diagram of a controller to control the laser machining apparatus of FIG. 7, according to one or more exemplary embodiments.

FIG. 7 is a perspective view of a laser machining apparatus, according to one or more exemplary embodiments. FIG. 8 is a block diagram of a controller to control the laser machining apparatus of FIG. 7, according to one or more exemplary embodiments.

Referring to FIGS. 7 and 8, laser machining apparatus (or apparatus) 700 includes laser oscillator 701, stage 703, and carrier (or transfer) mechanism 705. Apparatus 700 may include or interface with a controller, such as controller 800, that is configured to control one or more features and functions of apparatus 700. Although specific reference will be made to this implementation, it is contemplated that apparatus 700 may embody many forms and include multiple and/or alternative components. For example, it is contemplated that one or more components of apparatus 700 may be combined, formed as part of separate structures, etc.

Laser oscillator 701 may be a short pulse laser oscillator, such as a short-pulse carbon dioxide ($CO_2$) laser oscillator, configured to direct laser beam 707 towards workpiece 709, such as flexible display panel 100, to form cut portion CP in workpiece 709. In this manner, workpiece (or target) 709 may be supported by stage 703. According to one or more exemplary embodiments, carrier mechanism 705 is configured to cause relative movement (e.g., scanning, panning, rotating, etc.) between laser oscillator 701 and workpiece 709. For instance, carrier mechanism 705 may displace and/or rotate laser oscillator 701 relative to workpiece 709 having a fixed position, may displace and/or rotate workpiece 709 relative to laser oscillator 701 having a fixed position, or may displace and/or rotate both laser oscillator 701 and workpiece 709 relative to the another. To this end, workpiece 709 may be fixed on stage 703 using any suitable mechanism (not shown), such as a clamping mechanism, to fix a position of workpiece 709 relative to stage 703.

According to one or more exemplary embodiments, laser oscillator 701 may produce laser beam 707, which may be guided and focused via one or more optical components 701B, such as one or more lenses, mirrors, optical fibers, and/or the like. In this manner, laser oscillator 701 may include, as a light excitation source, a solid laser, such as a fiber laser. An oscillator source of laser oscillator 701 may be a semiconductor laser, which may include a plurality of excitation light sources. Although not illustrated, laser oscillator 701 may include (or interface with) a condenser and/or amplifier.

In one or more exemplary embodiments, controller 800 may be configured to variably adjust one or more output parameters of laser oscillator 701 to variably adjust one or more features of laser beam 707. For instance, controller 800 may adjust a power of laser beam 707, a duty cycle of laser beam 707 (e.g., an on/off of laser oscillator 701, such as adjust at least one of a period of laser beam 707 and a pulse width of laser beam 707), a spot size of laser beam 707, a spot pitch between adjacent spots of laser beam 707, a depth of focus of laser beam 707, a formation pattern of laser beam 707, a position of laser oscillator 701 or laser beam 707, etc. It noted that various adjustable features of laser oscillator 701, stage 703, and carrier mechanism 705 are described in relation to effects on laser beam 707 in association with FIGS. 9 to 11, 12A to 12C, 13, and 14.

The above-noted output parameters, as well as one or more other parameters, e.g., relative scan speed, etc., may be stored to at least one memory accessible to controller 800, such as memory 801, remote device 803 (which may correspond to one or more components of an assembly line controller), etc. In this manner, controller 800 may generate (e.g., via one or more processors 805) one or more control signals to control at least one of laser oscillator 701, optical components 701B, stage 703, carrier mechanism 705, etc. In this manner, controller 800 and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

Control signals generated via controller 800 may be transmitted to at least one of laser oscillator 701, optical components 701B, stage 703, and carrier mechanism 705 via communication interface 809, which may transmit and receive signals via any suitable wired and/or wireless medium. As such, processor 805 may be configured to interpret and execute a laser machining program, such as one or more sequences of one or more instructions that, when executed by processor 805, cause apparatus 700 to perform at least one of the features, functions, processes, etc., described herein. To this end, the laser machining program may be input to controller 800 via memory 801, remote device 803, user interface 807, etc.

User interface 807 may provide display information to a user of apparatus 700, as well as detect user input to apparatus 700 to control an operation of apparatus 700. In this manner, user interface 807 may include a display controller interfacing with a display device (not shown) coupled to apparatus 700. User interface 807 may also generate corresponding input data in response to detecting user input to apparatus 700. As such, user interface 807 may include an input device (not illustrated) configured to detect a command or information from a user, such as a key pad, a mouse, a finger scan sensor, a dome switch, a touchpad, a jog wheel, joystick, etc.

Memory 801 may be at least one of a volatile storage and a non-volatile storage that includes various types of storage that retain stored data regardless power conditions. For example, memory 801 may include at least one of various types, such as a flash memory, a hard disk, a read-only memory (ROM), a programmable ROM (PROM), an electrically programmable ROM (EPROM), an electrically erasable and programmable ROM (EEPROM), a random-access memory (RAM), a phase-change RAM (PRAM), a magnetic RAM (MRAM), a resistive RAM (RRAM), a ferroelectric RAM (FRAM), etc. It is also contemplated that memory 801 may correspond to an external memory, such as a static RAM (SRAM), a magnetoresistive (MRAM), an embedded dynamic RAM (embedded DRAM), etc. Exemplary embodiments, however, are not limited thereto or thereby. Memory 801 may operate in response to control of processor 805, and may include an interface for controlling multiple memories. To this end, memory 801 may be any medium that participates in providing code to the one or more software, hardware, and/or firmware components for execution.

As previously mentioned, apparatus 700 may provide laser beam 707 (e.g., a $CO_2$ short-pulse laser beam) as a medium to form cut portion CP in workpiece 709. For instance, laser oscillator 701 may be utilized to form cut portion CP in flexible display panel 100 that may form or be utilized to form notched portion NP. Features affecting formation of cut portion CP in one or more layers of a flexible display panel are described with reference to FIGS. 9 and 10.

Figure 9:
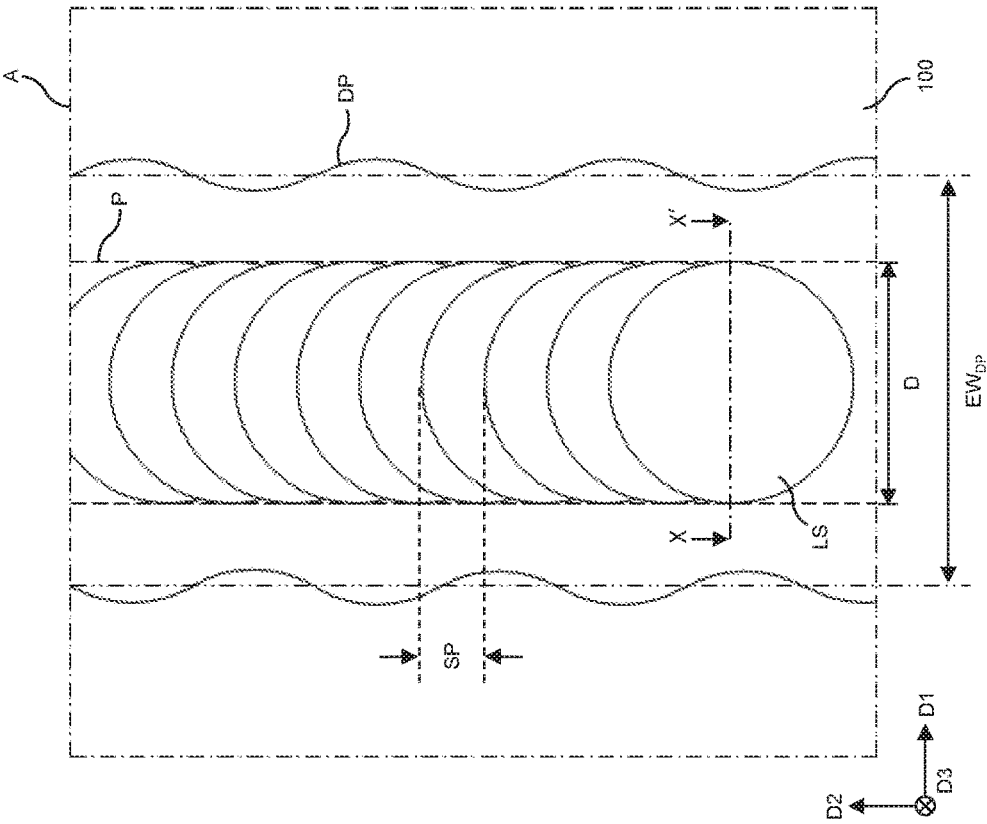
FIG. 9 is a plan view of a cut portion of a flexible display panel, according to one or more exemplary embodiments.

FIG. 9 is a plan view of a cut portion of a flexible display panel, according to one or more exemplary embodiments.

Figure 10:
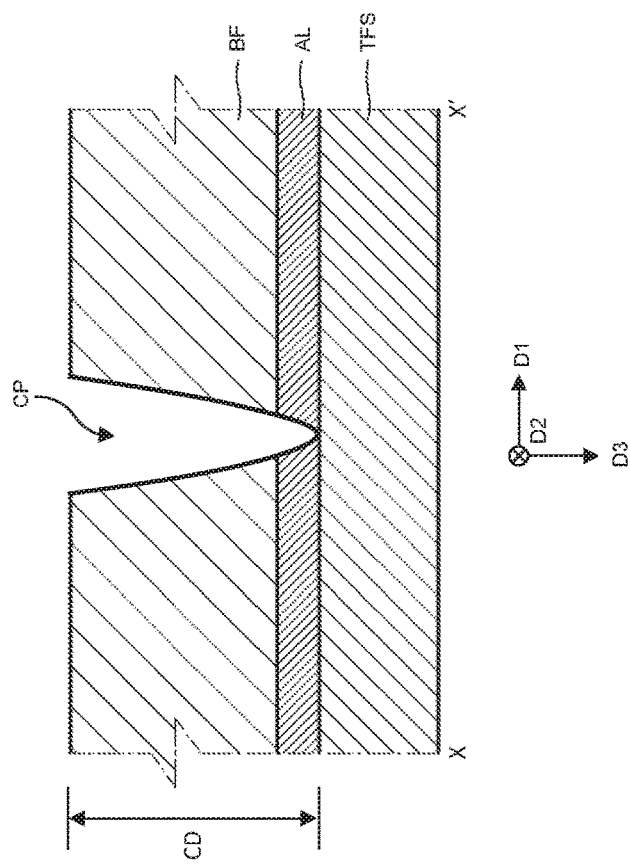
FIG. 10 is a cross-sectional view of the cut portion of FIG. 9 taken along sectional line X-X', according to one or more exemplary embodiments.

FIG. 10 is a cross-sectional view of the cut portion of FIG. 9 taken along sectional line X-X', according to one or more exemplary embodiments. For illustrative and descriptive convenience, FIGS. 9 and 10 are described with reference to flexible display panel 100 and apparatus 700.

Referring to FIG. 9, laser oscillator 701 is configured to provide a pulsating laser beam, e.g., short-pulse $CO_2$ laser beam, that radiates laser spots LS along path P on flexible display panel 100. Laser spots LS may be circular in shape when viewed in third direction D3, however, exemplary embodiments are not limited thereto or thereby. In one or more exemplary embodiments, carrier mechanism 705 is configured to cause relative movement (e.g., scanning) between laser oscillator 701 and flexible display panel 100 such that adjacent laser spots LS overlap one another. For instance, laser oscillator 701 and flexible display panel 100 may be relatively scanned in second direction D2 at a relative scan speed, e.g., greater than or equal to 200 mm/s and less than or equal to 600 mm/s, such as in 100 mm/s increments from 200 mm/s to 600 mm/s, for instance, 50 mm/s increments from 200 mm/s to 600 mm/s, etc. It is noted, however, that exemplary embodiments are not limited thereto or thereby. In this manner, a size (e.g., diameter) D of adjacent laser spots LS may also affect the overlapping of adjacent laser spots LS. For instance, laser spots LS may have diameter D from greater than 0 µm to less than or equal to 100 µm, e.g., greater than or equal to 10 µm and less than or equal to 70 µm, for instance, greater than or equal to 20 µm and less than or equal to 40 µm. In one or more exemplary embodiments, laser spots LS may have a diameter of 30 µm±3%.

The overlapping of adjacent laser spots LS may also be affected by the duty cycle of laser oscillator 701, e.g., at least one of a period of laser oscillator 701 and a pulse width of laser oscillator 701. For instance, laser oscillator 701 may have a period (or repetition rate), such as greater than or equal to 10 kHz and less than or equal to 20 kHz, e.g., 10 kHz, 15 kHz, 20 kHz, etc. It is contemplated, however, that exemplary embodiments are not limited thereto or thereby. The pulse width of laser oscillator 701 may be greater than or equal to 18.75 µs and less than or equal to 84.375 µs, such as greater than or equal to 20.3125 µs and less than or equal to 81.25 µs. For example, the pulse width may be greater than or equal to 20.3125 µs and less than or equal to 25.5625 µs. For instance, the pulse width may be greater than or equal to 25 µs and less than or equal to 35.9375 µs. As another example, the pulse width may be greater than or equal to 35.9375 µs and less than or equal to 53.125 µs. For instance, the pulse width may be greater than or equal to 45.3125 µs and less than or equal to 65.625 µs. For example, the pulse width may be greater than or equal to 53.125 µs and less than or equal to 81.25 µs. Exemplary embodiments, however, are not limited thereto or thereby.

It is recognized that one or more sources of variation may affect the performance of apparatus 700, e.g., the formation of laser beam 707, and, thereby, the energy density of laser beam 707. Variations in the energy density may affect dimensional tolerances of cut portion CP, such as dimensional tolerances in cut depth CD. To this end, heat transfer effects associated with the energy density of laser beam 707 may increase a damaged portion of flexible display panel 100 from an area associated with laser spots LS to damaged area DP having effective width $EW_{DP}$ in first direction D1 that is greater than diameter D of laser spots LS. Regions between path P (illustrated as a dashed line in FIG. 9) and damaged portion DP (depicted as a curved solid line in FIG. 9) may or may not correspond to an actually cut portion of flexible substrate 100. In this manner, some portion of these regions may be actually cut, whereas other portions may simply be damaged, such as exhibit volumetric changes as a result of laser radiation. Table 1 includes various sources contributing to the variability in the energy density of laser beam 707.

TABLE 1

| Source of Variation | Variation |
|---|---|
| Laser Power Stability | ±3% |
| Beam Size due to Depth of Focus | ±3% |
| Distribution in Adhesive Layer Thickness | ±1% |
| Laser Characteristics (Beam Size, Divergence, etc.) | ±8% |
| Flatness of Flexible Substrate | |
| Stage Position | |
| Contaminates Effecting Optical Components | |
| Thermal Effects on Optical Components | |
| O/L Variations due to Scanner Acceleration/Deceleration | |
| O/L Variations due to Vibration | |
| Film Surface Contaminates | |
| Sum of Potential Variation | <±15% |

As previously mentioned, variations in the energy density of laser beam 707 may cause, at least in part, variations in cut depth CD. For instance, cut portion CP may be suitably formed in a first area of flexible display panel 100. For example, cut portion CP may extend through support layer BF and adhesive layer AL, as seen in FIG. 10, but not extend into flexible substrate TFS. It is contemplated, however, that cut portion CP may extend through support layer BF, or may extend through support layer BF and partially through adhesive layer AL.

Variations in the energy density of laser beam 707 may cause, at least in part, cut portion CP to be formed too shallow in a second area of flexible display panel 100 and/or too deep in a third area of flexible display panel 100. It is noted that, when cut portion CP is formed too shallow, notched portion NP may not be sufficiently formed. As such, when flexible display panel 100 is bent, stress may build and degrade performance (e.g., display quality, crack generation, etc.) of flexible display panel 100. When cut portion CP is formed too deep, cut portion CP and/or notched portion NP may extend into flexible substrate TFS, and, in this manner, may affect the structural integrity of flexible display panel 100. This may also affect performance of flexible display panel 100.

According to one or more exemplary embodiments, controller 800 is configured to control apparatus 700 to control cut depth CD by controlling an overlap ratio between adjacent (or consecutive) laser spots LS of laser beam 707. Control of cut depth CD via control of the overlap ratio is described in more detail in association with FIGS. 11 and 12A to 12C.

Figure 12A:
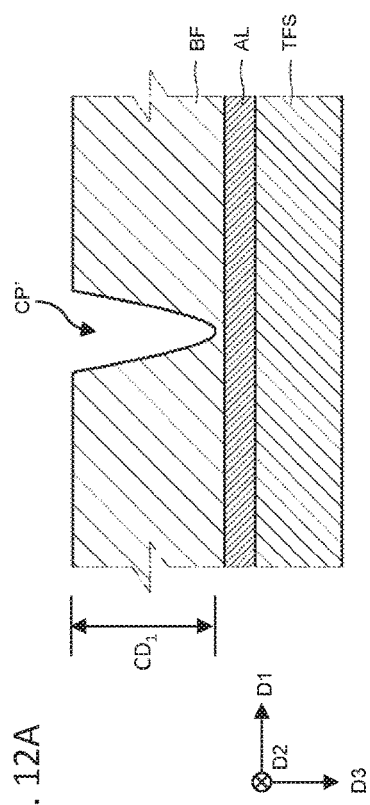
FIGS. 12A, 12B, and 12C are respective cross-sectional views of a cut portion of a flexible display panel, according to one or more exemplary embodiments.
Figure 12B:
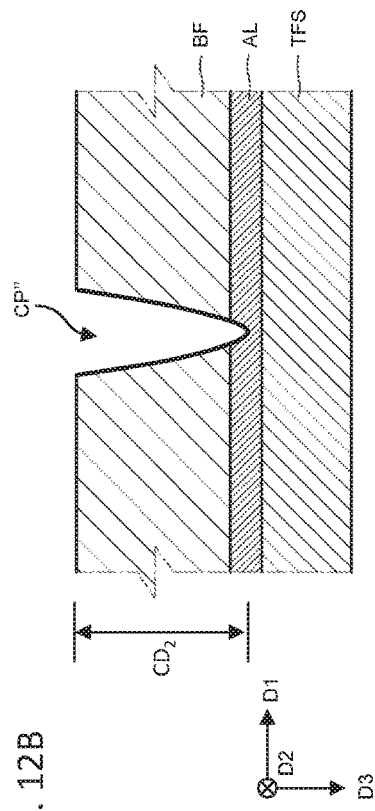
Figure 12C:
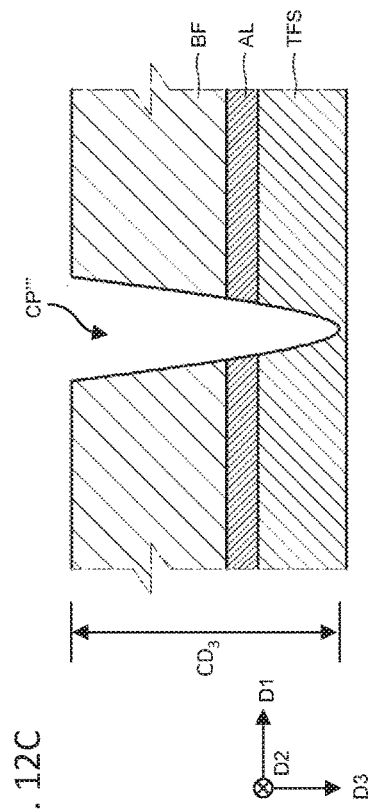
Figure 11:
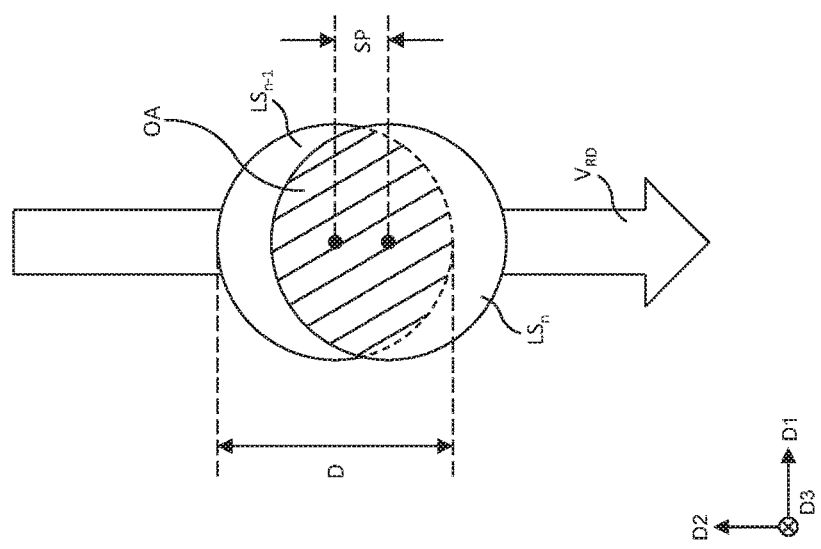
FIG. 11 is a plan view of consecutive laser pulses of the laser machining apparatus of FIG. 7, according to one or more exemplary embodiments.

FIG. 11 is a plan view of consecutive laser pulses of the laser machining apparatus of FIG. 7, according to one or more exemplary embodiments. FIGS. 12A, 12B, and 12C are respective cross-sectional views of a cut portion of a flexible display panel, according to one or more exemplary embodiments. For illustrative and descriptive convenience, FIGS. 11 and 12A to 12C are described with reference to flexible display panel 100 and apparatus 700.

With reference to FIGS. 1, 7 to 11, and 12A to 12C, controller 800 is configured to control apparatus 700 to control cut depth CD by controlling an overlap ratio between adjacent or otherwise consecutive laser spots LS of laser beam 707, which may be related to (such as proportional to) the amount of overlap area OA between adjacent laser spots LS, e.g., laser spot $LS_{n-1}$ and laser spot $LS_n$. It is noted that by controlling the overlap ratio, controller 800 may also control pitch SP between laser spots LS. In one or more exemplary embodiments, the overlap ratio may be determined, and, thereby, controlled based on Equation 1.

$$\text{Overlap Ratio} = (ESS-SP)/ESS \qquad \text{Eq. 1}$$

where:
ESS=Effective spot size=$EW_{DP}$; and
SP=Pitch between adjacent laser spots.

In one or more exemplary embodiments, controller 800 may adjust various parameters of apparatus 700 to control the overlap ratio, such as speed $V_{RD}$ of relative displacement between laser oscillator 701 and flexible display panel 100, the period of laser oscillator 701, the pulse width of laser oscillator 701, and size D of laser spots LS. To this end, controller 800 may also adjust the power of laser oscillator 701 and a depth of focus of laser oscillator 701. For instance, the depth of focus may be controlled to be greater than or equal to 180 µm and less than or equal to 220 µm, such as 200 µm.

According to one or more exemplary embodiments, when the other configurable parameters are held constant (apart from expected tolerance differences), the amount of overlap area OA may decrease and pitch SP may increase as the speed $V_{RD}$ of relative displacement between laser oscillator 701 and flexible display panel 100 increases. As the amount of overlap area OA decreases and pitch SP increases, less energy is transferred to flexible display panel 100, and, in this manner, a cut depth CD may decrease. For instance, with increasing speed $V_{RD}$ of relative displacement, the cut depth may transition from cut depth $CD_3$ in FIG. 12C, to cut depth CD in FIG. 10, to cut depth $CD_2$ in FIG. 12B, to cut depth $CD_1$ in FIG. 12A. It is noted, however, that cut depth $CD_1$ may be too shallow, whereas cut depth $CD_3$ may be too deep. As such, controller 800 may be configured to adjust at least one of the power of laser oscillator 701, the period of laser oscillator 701, the pulse width of laser oscillator 701, and the size D of laser spots LS to account for variations in the speed $V_{RD}$ of relative displacement between laser oscillator 701 and flexible display panel 100.

In one or more exemplary embodiments, however, controller 800 may hold the size D of laser spots LS, the period of laser oscillator 701, and the power of laser oscillator 701 constant (aside from expected tolerance differences), and, thereby, adjust the pulse width of laser oscillator 701 and the speed $V_{RD}$ of relative displacement to control the amount of overlap area OA and pitch SP between adjacent laser spots LS. In this manner, controller 800 may control the above-noted overlap ratio. When, however, the power of laser oscillator 701 is held constant (aside from expected tolerance differences), less energy may be transferred to flexible display panel 100 with increasing speed $V_{RD}$ of relative displacement. In this manner, as speed $V_{RD}$ of relative displacement increases, controller 800 may increase the pulse width of laser oscillator 701, and vice versa.

To account for the one or more sources of variation (e.g., tolerance differences), controller 800 may control apparatus 700 to control the overlap ratio to be greater than or equal 0.80 and less than or equal to 0.90. When the overlap ratio is less than 0.80, cut depth $CD_1$ may not extend through support layer BF, as seen in FIG. 12A. This may prevent notched portion NP from being sufficiently formed and affect performance of flexible display panel 100, as previously described. When the overlap ratio is greater than 0.90, cut depth $CD_3$ may extend into flexible substrate TFS, as seen in FIG. 12C. This may affect the structural integrity of flexible display panel 100, and, thereby, performance of flexible display panel 100, as previously described.

According to one or more exemplary embodiments, controller 800 may control the overlap ratio to decrease within the above-noted range with increasing speed $V_{RD}$ of relative displacement to achieve acceptable cut depths, such as cut depth CD and $CD_2$. In this manner, controller 800 may be afforded greater variability in a range of suitable pulse widths (and, thereby, energy margins) of laser oscillator 701. For instance, as the overlap ratio approaches 0.80, variability in a range of suitable pulse widths (and, thereby, an energy margin of laser oscillator 701) may increase by almost 25%. This not only allows for faster manufacturing, but it also allows for wider tolerances that may also decrease manufacturing costs.

In one or more exemplary embodiments, the overlap ratio may also affect the linearity of the sidewalls of cut portion CP along path P. Control of the linearity of the sidewalls of cut portion CP along path P via control of the overlap ratio is described in more detail in association with FIGS. 13 and 14.

Figure 13:
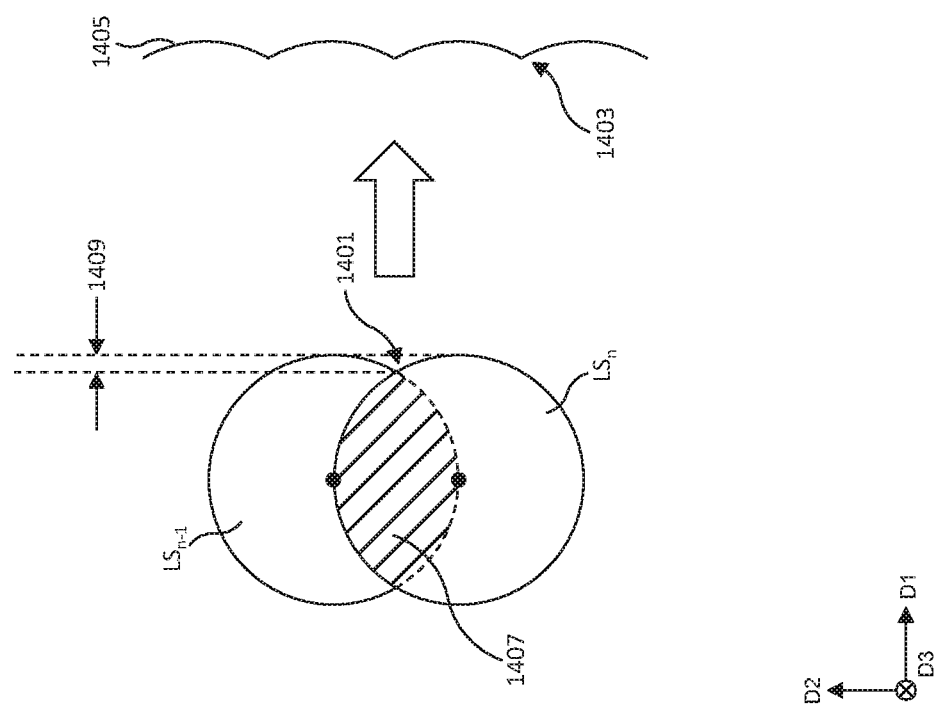
FIGS. 13 and 14 are respective plan views of consecutive laser pulses, according to one or more exemplary embodiments.
Figure 14:
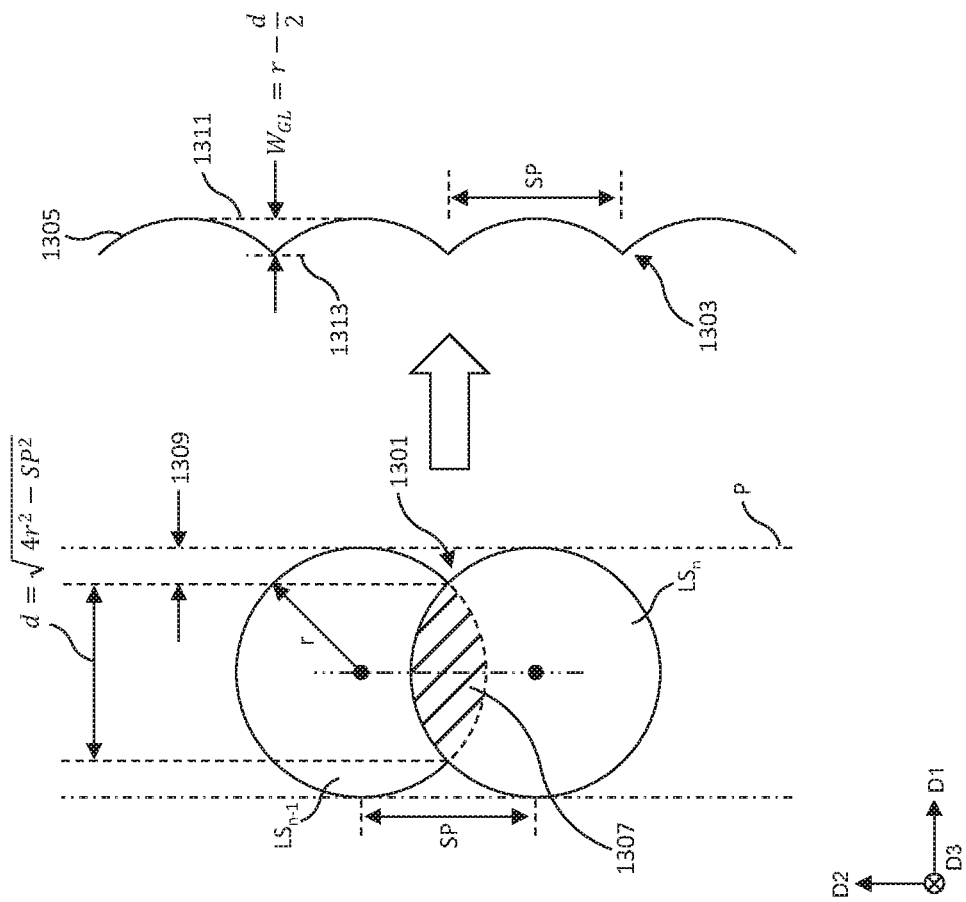

FIGS. 13 and 14 are respective plan views of consecutive laser pulses, according to one or more exemplary embodiments. For illustrative and descriptive convenience, FIGS. 13 and 14 are described with reference to flexible display panel 100 and apparatus 700.

With reference to FIGS. 1, 7 to 11, 13, and 14, it is noted that fine grains (or grain lines) resulting, at least in part, from short-pulse laser radiation of flexible display panel 100 may be formed on surfaces of flexible display panel 100 during formation of cut portion CP. For instance, rapid energy changes between consecutive laser pulses $LS_{n-1}$ and $LS_n$ and spaces (e.g., spaces 1301 and 1401) disposed between consecutive laser pulses $LS_{n-1}$ and $LS_n$ may form grains (e.g., grains 1303 and 1403) affecting the linearity of cut lines (e.g., cut lines 1305 and 1405) along path P. It is noted, however, that cutting flexible display panel 100 utilizing apparatus 700 versus utilizing a wheel cutter, generates fewer cracks and improves the mechanical strength of flexible display panel 100. As can be appreciated from a comparison of FIGS. 13 and 14, as the overlap area increases from overlap area 1307 to overlap area 1407, a size of the space between consecutive laser pulses $LS_{n-1}$ and $LS_n$ decreases from first size 1309 to second size 1409. As the size decreases from first size 1309 to second size 1409, the linearity of a corresponding cut line increases from a first linearity with respect to cut line 1305 to a second linearity with respect to cut line 1405.

According to one or more exemplary embodiments, the size of the space between consecutive laser pulses $LS_{n-1}$ and $LS_n$ affects a width of corresponding grains formed along a respective cut line. For instance, the size of space 1301 affects width $W_{GL}$ of grains 1303 formed along cut line 1305. It is noted that width $W_{GL}$, may be measured in first direction D1 from first edge 1311 of cut line 1305 to second edge 1313 of cut line 1305. With respect to path P of consecutive laser pulses $LS_{n-1}$ and $LS_n$, first edge 1311 may correspond to an outermost edge of cut line 1305 and second edge 131 may correspond to an innermost edge of cut line 1305.

In one or more exemplary embodiments, widths $W_{GL}$, of corresponding grains 1303 may be determined according to a size of overlap area 1307 that is related to pitch SP between consecutive laser pulses $LS_{n-1}$ and $LS_n$. Assuming consecutive laser pulses $LS_{n-1}$ and $LS_n$ have a circular shape when viewed in third direction D3, then width d of overlap area 1307 may be determined according to Equation 2.

$$d=\sqrt{(4r^2-SP^2)} \qquad \text{Eq. 2}$$

where:
r=Radius of consecutive laser spots $LS_n$ and $LS_{n-1}$; and
SP=Pitch between consecutive laser spots $LS_n$ and $LS_{n-1}$.

Given that the width of path P is twice the size of radius r of consecutive laser pulses $LS_{n-1}$ and $LS_n$, then the width of space 1301 in first direction D1, and, thereby, width $W_{GL}$ of grains 1303 in first direction D1 may be determined according to Equation 3.

$$W_{GL}=r-(d/2) \qquad \text{Eq. 3}$$

As previous mentioned, controller 800 may control apparatus 700 to control the overlap ratio to be greater than or equal to 0.80 and less than or equal to 0.90. In this manner, a ratio between width $W_{GL}$ and pitch SP between consecutive laser pulses $LS_{n-1}$ and $LS_n$ (and, thereby, between adjacent grains 1303) may be greater than or equal to 0.0150 and less than or equal to 0.0450, such as greater than or equal to 0.0175 and less than or equal to 0.0425, e.g., greater than or equal to 0.0196 and less than or equal to 0.0397, e.g., about 0.02 to about 0.04.

Figure 16:
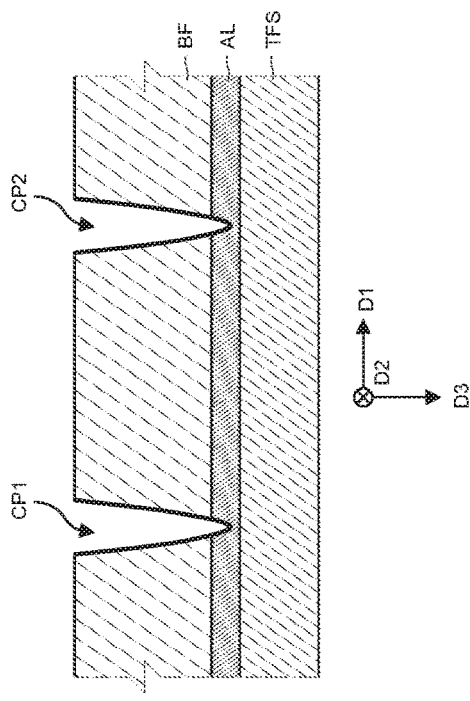
FIGS. 16 and 17 are respective cross-sectional views of a flexible display panel at various stages of manufacture, according to one or more exemplary embodiments.
Figure 17:
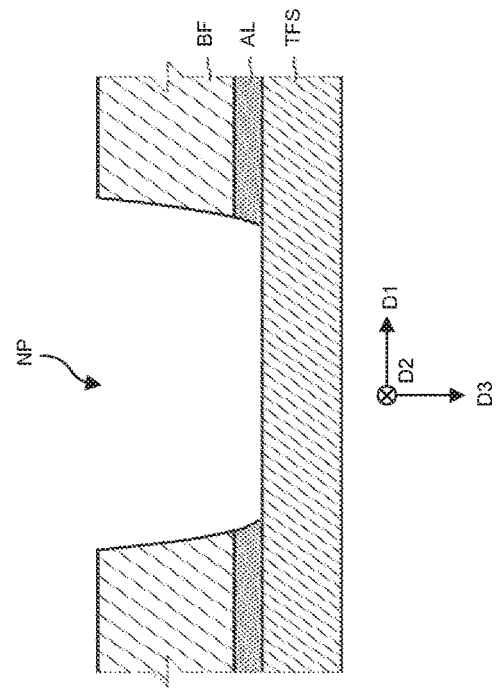
Figure 15:
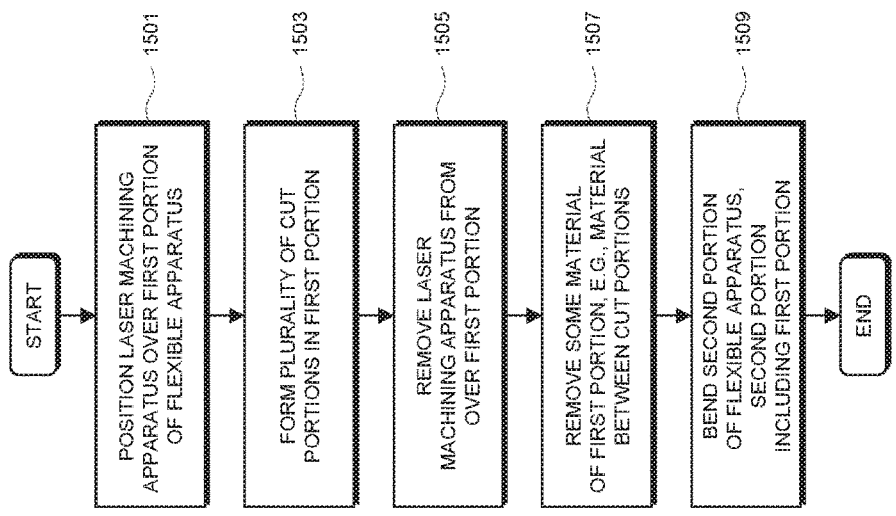
FIG. 15 is flowchart of a process for notching and bending a flexible display panel, according to one or more exemplary embodiments.

FIG. 15 is flowchart of a process for notching and bending a flexible display panel, according to one or more exemplary embodiments. FIGS. 16 and 17 are respective cross-sectional views of a flexible display panel at various stages of manufacture, according to one or more exemplary embodiments. For illustrative and descriptive convenience, FIGS. 15 to 17 are described with reference to flexible display panel 100 and apparatus 700.

At step 1501, apparatus 700 is positioned over a first portion of flexible display panel 100, e.g., over a portion of second non-display area NDA2. In this manner, support layer BF may face laser oscillator 701. That is, support layer BF may be disposed between laser oscillator 701 and flexible substrate TFS. As seen in FIG. 16, laser oscillator 701 may be utilized to form a plurality of cut portions (e.g., first cut portion CP1 and second cut portion CP2) in support layer BF, per step 1503. As part of forming the plurality of cut portions, controller 800 may control apparatus 700 to output laser beam 707 in a pulsating fashion while relatively displacing flexible display panel 100 and laser oscillator 701 with respect to one another. In this manner, controller 800 may control an overlap ratio between consecutive laser spots LS of laser beam 707 to be greater than or equal to 0.80 and less than or equal to 0.90.

According to one or more exemplary embodiments, controller 800 may also control, via carrier mechanism 705, speed $V_{RD}$ of relative displacement between laser oscillator 701 and flexible display panel 100 to be greater than or equal to 200 mm/s and less than or equal to 600 mm/s. Controller 800 may control a period of laser oscillator 701 to be greater than or equal to 10 kHz and less than or equal to 20 kHz, as well as control a pulse width of laser beam 707 to be greater than or equal to 20.3125 µs and less than or equal to 81.25 µs. Further, controller 800 may control a depth of focus of laser beam 707 to be greater than or equal to 180 µm and less than or equal to 220 µm, such as 200 µm.

In one or more exemplary embodiments, first cut portion CP1 and second cut portion CP2 may be formed longitudinally extending in second direction D2, having a width in first direction D1, and a thickness (or cut depth) in third direction D3. To this end, the cut depths of first cut portion CP1 and second cut portion CP2 may extend through support layer BF and at least partially extend into adhesive layer AL. It is noted, however, that first cut portion CP1 and second cut portion CP2 may not extend into flexible substrate TFS.

At step 1505, apparatus 700 is removed from over the first portion of flexible display panel 100. In step 1507, one or more layers of flexible display panel 100 may be notched in association with the plurality of cut portions to form notched portion NP, as seen in FIG. 17. For instance, support layer BF may be scrapped, delaminated, or otherwise removed from flexible substrate TFS between first cut portion CP1 and second cut portion CP2. For instance, a portion of support layer BF disposed between first cut portion CP1 and second cut portion CP2 may be pulled off utilizing, for example, an applied adhesive to delaminate the portion of support layer BF from flexible substrate TFS. In this manner, a corresponding portion of adhesive layer AL may also be removed between first cut portion CP1 and second cut portion CP2 when support layer BF is being pulled. As another example, a scraping tool may be utilized to scrape out support layer BF and adhesive layer AL from between first cut portion CP1 and second cut portion CP2. It is also contemplated that notched portion NP may be formed using apparatus 700, e.g., forming further cut portions between first cut portion CP1 and second cut portion CP2.

According to one or more exemplary embodiments, a second portion of flexible display panel 100 including notched portion NP may be bent from a third portion of flexible display panel 100, per step 1509. For instance, after formation of notched portion NP, second non-display area NDA2 may be bent from display area DA (e.g., bent from plane PL of display area DA), and, thereby, bent about bending axis BX, such that at least some of second non-display portion NDA2 is disposed under display area DA, as seen in FIG. 4A. It is also contemplated that the process of FIG. 15 may be utilized to form additional and/or alternative bends in flexible display panel 100, e.g., a bend about bending axis BX', as seen in FIG. 4B. In this manner, a bending radius (e.g., bending radius R) of flexible display panel 100 may be greater than or equal to twice the thickness of support layer BF, such as greater than or equal to about 200 µm. It contemplated, however, that larger bending radii may be formed.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a flexible display panel, the method comprising:
    forming a groove in a first area of a layered structure of the flexible display panel, the groove extending into at least two layers of different materials; and
    bending a portion of the first area comprising the groove from a plane of a second area of the layered structure, the second area extending from the first area,
    wherein forming the groove comprises radiating a pulsating laser beam along an imaginary line corresponding to the groove such that an overlap ratio between consecutive pulse spots of the pulsating laser beam is greater than or equal to 0.80 and less than or equal to 0.90.

2. The method of claim 1, wherein the layered structure comprises:
    a flexible substrate;
    a support layer disposed on a surface of the flexible substrate; and
    an adhesive layer coupling the support layer to the surface of the flexible substrate.

3. The method of claim 2, wherein the groove extends into the support layer and the adhesive layer.

4. The method of claim 3, wherein the groove partially extends into the adhesive layer such that each surface of the groove is disposed at or above a lower surface of the adhesive layer contacting the surface of the flexible substrate.

5. The method of claim 1, further comprising:
    forming, in the first area, another groove in the layered structure, the another groove being spaced apart from the groove; and
    removing a part of the portion of the first area, the part being disposed between the groove and the another groove.

6. The method of claim 5, wherein removing the part comprises delaminating the part from the layered structure.

7. The method of claim 1, wherein forming the groove further comprises:
    modifying an energy margin of the pulsating laser beam at a point between endpoints of the imaginary line.

8. The method of claim 7, wherein the energy margin of the pulsating laser beam is modified in response to detecting a change in speed of a relative scan between the pulsating laser beam and the layered structure.

9. The method of claim 1, wherein:
    the overlap ratio is equivalent to (ESS−SP)/ESS;
    ESS represents a width of an area damaged by the pulsating laser beam, the width being perpendicular to a longitudinal direction of the groove and being greater than a corresponding width of a pulse spot of the consecutive pulse spots; and
    SP represents a pitch between the consecutive pulse spots of the pulsating laser beam.

10. The method of claim 1, wherein a pulse width of the pulsating laser beam is greater than or equal to 18.75 µs and less than or equal to 84.375 µs.

11. The method of claim 1, wherein forming the groove comprises:
    setting a relative scan speed between the pulsating laser beam and the layered structure, the relative scan speed being greater than or equal to 200 mm/s and less than or equal to 600 mm/s; and
    setting a period of the pulsating laser beam, the period being greater than or equal to 10 kHz and less than or equal to 20 kHz.

12. The method of claim 1, wherein:
    the second area is a display area of the flexible display panel; and
    the first area is a non-display area of the flexible display panel.

13. The method of claim 1, wherein the first area and the second area correspond to portions of a display area of the flexible display panel.

14. The method of claim 1, wherein a depth of focus of the pulsating laser beam is greater than or equal to 180 µm and less than or equal to 220 µm.

* * * * *